United States Patent
Laurens (10) Patent No.: US 6,171,894 B1
(45) Date of Patent: Jan. 9, 2001

(54) METHOD OF MANUFACTURING BICMOS INTEGRATED CIRCUITS ON A CONVENTIONAL CMOS SUBSTRATE

(75) Inventor: Michel Laurens, Saint Egreve (FR)

(73) Assignee: STMicroelectronics S.A., Gentilly (FR)

( * ) Notice: Under 35 U.S.C. 154(b), the term of this patent shall be extended for 0 days.

(21) Appl. No.: 09/443,404

(22) Filed: Nov. 19, 1999

(30) Foreign Application Priority Data

Nov. 30, 1998 (FR) .................................................. 98 15239

(51) Int. Cl.$^7$ .............................................. H01L 21/8238

(52) U.S. Cl. .......................... 438/202; 438/341; 438/363; 438/234

(58) Field of Search .................... 438/202, 234, 438/309, 341, 365, 363

(56) References Cited

U.S. PATENT DOCUMENTS

| | | | |
|---|---|---|---|
| 4,812,890 | 3/1989 | Feygenson | 357/34 |
| 5,177,582 | 1/1993 | Meister et al. | 257/588 |
| 5,557,131 | 9/1996 | Lee | 257/370 |
| 5,702,959 | 12/1997 | Hutter et al. | 437/31 |
| 5,766,990 | * 6/1998 | El-Diwany | 438/234 |
| 5,837,574 | * 11/1998 | Bergemont et al. | 438/202 |
| 5,989,968 | * 11/1999 | Kim et al. | 438/202 |

FOREIGN PATENT DOCUMENTS

| | | | |
|---|---|---|---|
| 0 281 235 | 9/1988 | (EP) | H01L/21/82 |
| 0 769 810 | 4/1997 | (EP) | H01L/21/331 |

OTHER PUBLICATIONS

European Search Report from European application No. 99 41 0172, related to the instant application.

Chantre et al., A High Performance Low Complexity SiGe HBT for BiCMOS Integration , Proceedings of the 1998 Bipolar/BICMOS Circuits and Technology meeting (Cat. No. 98CH36198) Proceedings of the 1998 Bipolar/BICMOS Circuits and Technology meeting, Minneapolis, MN Sep. 27–29, 1998, pp. 93–96, XP002132176.

Mouis et al., VLSI Integraton of SiGe Epitaxial Base Bipolar Transistors, 1998 URSI International Symposium on Signals, Systems, and Electronics conference Proceedings (Cat. No. 98EX167), 1998 URSI International Symposium on Signals, Systems, and Electronics conference Proceedings, Pisa, Italy Sep. 29–Oct. 2, 1998, pp. 50–55.

Nguyen–Ngoc D. et al. "A 200 MM Sige–HBT BICMOS Technology for Mixed Signal Applications" Proceedings of the 1995 Bipolar/BICMOS Circuits and Technology Meet, Minneapolis, Oct. 1–3, 1995, No. Meeting 10, pp. 89–92, Institute of Electrical and Electronics Engineers.

* cited by examiner

Primary Examiner—Trung Dang
(74) Attorney, Agent, or Firm—Wolf, Greenfield & Sacks, P.C.; James H. Morris; Theodore E. Galanthay (57) ABSTRACT

A method of manufacturing a BICMOS integrated circuit including an NPN transistor in a heavily-doped P-type wafer coated with a lightly-doped P-type layer, including the steps of forming an N well of collector of a bipolar transistor; coating the structure with a polysilicon seed layer and opening above collector well portions; growing undoped silicon, then P-type doped silicon to form a single-crystal silicon base region; depositing an insulating layer and opening it; depositing N-type emitter polysilicon and etching it outside useful areas; etching the base silicon outside useful areas; forming spacers; and forming a collector contact area at the same time as the drain implantation of the N-channel MOS transistors.

5 Claims, 6 Drawing Sheets

FIG. 5B

METHOD OF MANUFACTURING BICMOS INTEGRATED CIRCUITS ON A CONVENTIONAL CMOS SUBSTRATE

BACKGROUND OF THE INVENTION

1. Field of the Invention

The present invention relates to the manufacturing of integrated circuits, and more specifically of so-called BICMOS circuits, that is, circuits including bipolar transistors and complementary MOS transistors.

2. Discussion of the Related Art

In such structures, interest is generally more specifically focused on the quality of the NPN-type bipolar transistors, PNP transistors being by nature slower than NPN transistors. The NPN transistors must always be of good quality. A first and a second category of BICMOS integrated circuits are however distinguished. In the first category, the performance of the bipolar NPN transistors, which must enable operating at frequencies likely to reach a few gigahertz are essentially stressed. In the second category, the circuits include MOS transistors essentially performing the logic functions and bipolar transistors essentially intended for the input/output amplifiers and the implementation of a few analog functions. This latter case, in which the major part of an integrated circuit is formed by CMOS transistors and where the NPN bipolar transistors must be of fine quality without necessarily have to operate at very high frequencies on the order of one gigahertz will be considered herein.

Figure 1:
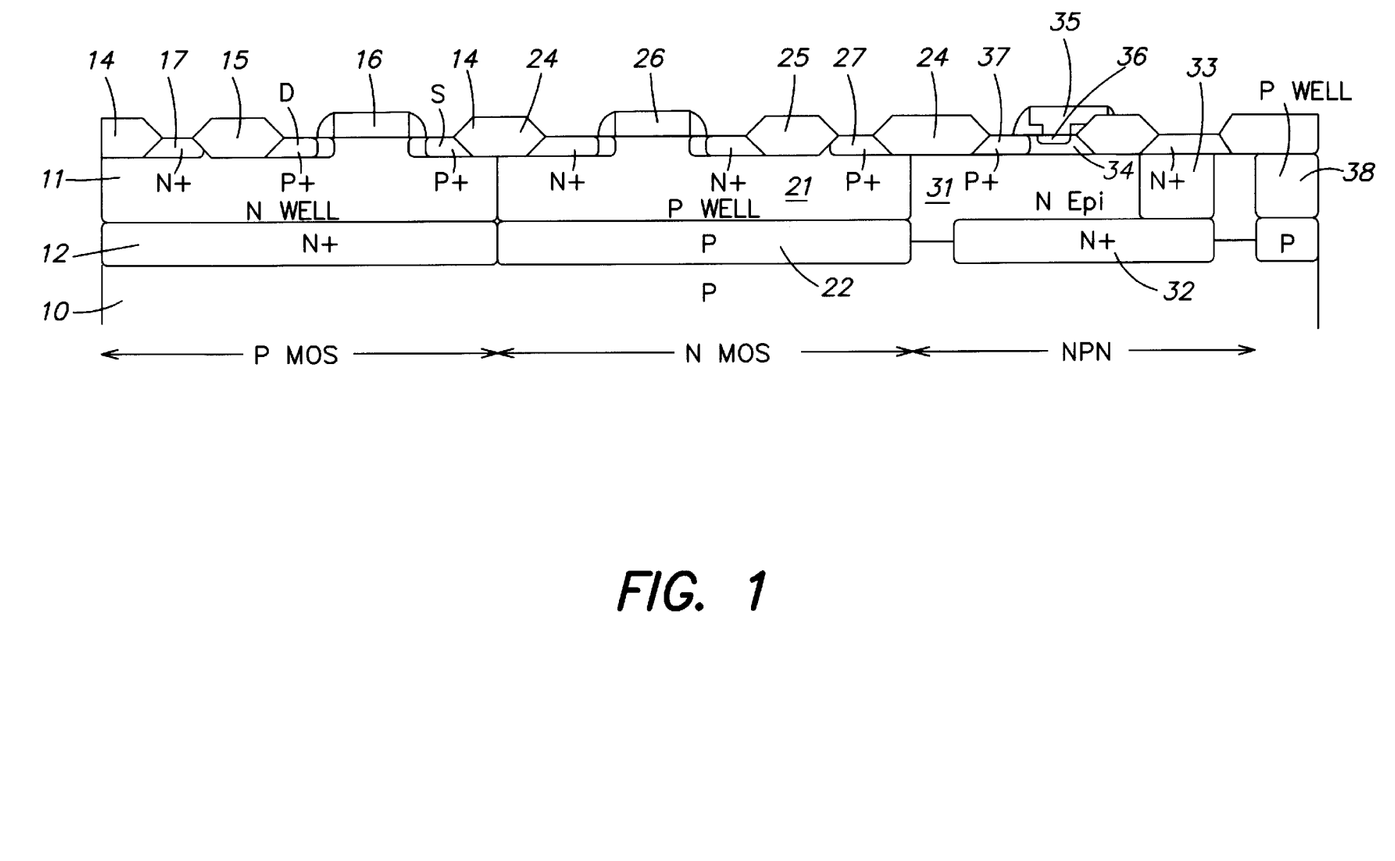
FIG. 1, previously described, illustrates a portion of a conventional integrated BICMOS circuit including a PMOS transistor, an NMOS transistor, and an NPN transistor.

FIG. 1 is a simplified cross-section view of a portion of a conventional BICMOS integrated circuit. The left-hand portion of the drawing includes a P-channel MOS transistor (PMOS), the center portion of the drawing contains an N-channel MOS transistor (NMOS) and the right-hand portion of the drawing contains an NPN-type bipolar transistor. The structure is formed from a single-crystal silicon wafer 10 of type P on which is formed an N-type epitaxied layer. Buried layers are formed at the interface between the silicon substrate and the epitaxial layer.

The P-channel MOS transistor is formed in an N-type well 11 (Nwell), preferably formed above a heavily-doped N-type layer 12, itself formed at the upper portion of substrate 10. The N well is delimited laterally and in surface by insulating areas, for example, a thick oxide 14 formed by so-called LOCOS techniques. Another thick oxide region 15 delimits a portion of N well 11. In the main portion of the N well is formed a P-channel MOS transistor including, on either side of a gate 16, drain and source regions D and S. Conventionally, this structure includes spacers and drain and source extension areas of low doping level (LDD). A heavily-doped N-type area 17 in the portion of the N well delimited by thick oxide 15 enables contacting the well.

The N-channel MOS transistor is formed complementarily in a P-type well 21 (Pwell) formed on a buried layer 22. The P well is delimited by a thick oxide 24 and a thick oxide 25 delimits a portion of the well. The N-channel transistor is formed in the main portion of the well on either side of an insulated gate 26. A heavily-doped P-type contact 27 enables connecting the P well.

The NPN-type bipolar transistor is formed in an area 31 of the N-type epitaxial layer located above a heavily-doped N-type buried layer 32. Region 31 corresponds to the collector and region 32 corresponds to a collector contact area which is connected to the surface of the integrated circuit via a heavily-doped N-type collector well 33. A base area 34 is formed by implantation and/or diffusion at the surface of the N-type epitaxial layer. Above this base region, a heavily-doped N-type polysilicon layer 35 enables creating, by diffusion, an emitter region 36 in base 34. A heavily-doped P-type area 37 is arranged laterally with respect to intrinsic base region 34, for example, as shown in the drawing and enables a base contact recovery. Further, N-type epitaxial layer portion 31 in which the bipolar transistor is formed must be isolated from the other components of the structure formed in the N-type epitaxial layer or in an N-type well. Thus, N-type region 31 must be surrounded with a P-type well. This P-type well may correspond, as shown to the left of the bipolar transistor, to a well in which is formed an N-channel MOS transistor or else, as shown by region 38 to the right of the drain, to a specific insulating wall 38 corresponding to a diffusion performed at the same time as the P-type wells.

A method of manufacturing the structure illustrated in FIG. 1 made on a P-type substrate (10) includes the following main steps:

implanting the N-type buried regions (12, 32);

implanting the P-type buried regions (22);

growing an epitaxial layer having for example a thickness on the order of 1 $\mu$m and a doping level on the order of $10^{16}$ atoms/cm$^3$;

forming the thick insulating oxide regions (14, 15, 24, 25);

implanting the N wells (11);

implanting the collector wells (33);

implanting the P wells (21) (and P insulating regions 38);

forming the gates of the N-channel and P-channel field effect transistors;

implanting the N-type lightly-doped regions (LDD), then implanting the P-type lightly-doped regions (LDD)— each time, simultaneously implanting the contact region of the well other than that in which the LDD source and drain implantations are performed; (for the following operations, the MOS transistor regions are masked and the bipolar transistors are formed)

implanting a P-type base region (34) in the epitaxial area (31);

masking an emitter region and depositing a heavily-doped N-type polysilicon layer (35);

delimiting the emitter contact layer (35);

forming the gate spacers of the MOS transistors and lateral spacers around the emitter contact polysilicon area; (for the following operations, the MOS transistor and bipolar transistor regions are both processed)

implanting the N-type drain-source regions of the N-channel transistors, the contact region with the N wells, and the collector contact region;

implanting the P-type drain-source regions of the P-channel transistors, the contact region with the P well, and the base contact region.

This method of manufacturing, in the same semiconductor substrate, complementary MOS transistors and bipolar transistors has, in particular, the following differences with a conventional method of manufacturing an integrated circuit only including complementary MOS transistors:

an N-type epitaxy on a P-type substrate is used, while a conventional method of CMOS transistor manufacturing uses a lightly-doped P-type epitaxy on a more heavily-doped P-type substrate;

the forming of the epitaxial layer is preceded by the forming of buried layers;

there is a specific deep doping step to form the collector wells.

Thus, as compared to a conventional method of CMOS transistor manufacturing, the method described hereabove of manufacturing a BICMOS transistor essentially has the disadvantage of requiring the forming of buried layers before forming an epitaxial layer. This considerably increases the manufacturing duration and costs. Indeed, it is more difficult, due to exodiffusion problems, to form an epitaxial layer on a inhomogeneous substrate including $N^+$ and $P^+$ regions than on a homogeneous substrate. Further, silicon manufacturers provide homogeneous substrates with an epitaxied layer, and since they manufacture such elements in large series, the costs are very competitive.

This complication of the manufacturing method is due to the fact that it is desired, for a bipolar transistor, to have in the vicinity of the base, a lightly-doped N-type collector region. Indeed, this light doping of the collector in the vicinity of its base helps to provide high gain and good voltage breakdown characteristics to a transistor. However, the lightly-doped collector region must not be too extensive to limit the resistance of access to the collector. Essentially due to these two considerations, integrated circuit NPN transistors almost systematically include $N^+$-type buried layers under an N-type epitaxy, the buried layer being used as a lightly resistive access to a lightly-doped collector.

SUMMARY OF THE INVENTION

Thus, an object of the present invention is to provide a novel BICMOS integrated circuit manufacturing method and structure.

Another object of the present invention is to provide such a method in which the number of manufacturing steps is reduced.

Another object of the present invention is to provide such a method which enables obtaining an NPN bipolar transistor of good quality.

To achieve these and other objects, the present invention provides a method of manufacturing a BICMOS integrated circuit including an NPN transistor in a heavily-doped P-type wafer coated with a lightly-doped P-type epitaxial layer, including the steps of forming an N-type doped well to form the collector of a bipolar transistor, this well having a relatively high and substantially homogeneous doping level; coating the structure with a polysilicon seed layer and opening the sandwich above portions of the collector well; epitaxially growing undoped silicon, then epitaxially growing P-type doped silicon forming above the collector region a single-crystal silicon base region; depositing an insulating layer and opening it at the location of the emitter; depositing N-type doped emitter polysilicon; etching the emitter polysilicon beyond useful areas; etching the base silicon outside the useful areas while leaving in place, in particular, a portion above a thick oxide region; forming spacers; forming a collector contact area at the same time as the drain implantation of the N-channel MOS transistors; and performing a P-type base contact area implantation at the same time as the drain and source implantations of the P-channel MOS transistors.

According to an embodiment of the present invention, the base epitaxy further includes a step of silicon-germanium epitaxy with a proportion of germanium on the order of 10 to 15%, this phase being performed after the phase of intrinsic silicon deposition.

According to an embodiment of the present invention, the collector well is formed at the same time as the wells of the P-channel MOS transistors.

According to an embodiment of the present invention, the seed silicon layer is deposited on a silicon oxide layer.

According to an embodiment of the present invention, the well has a surface doping level on the order of $10^{17}$ atoms/cm$^3$.

The foregoing objects, features and advantages of the present invention, will be discussed in detail in the following non-limiting description of specific embodiments in connection with the accompanying drawings.

DETAILED DESCRIPTION

As conventional in the representation of integrated circuits, the various drawings are not drawn to scale but their dimensions have been arbitrarily expanded to improve the readability of the drawings.

Figure 2A:
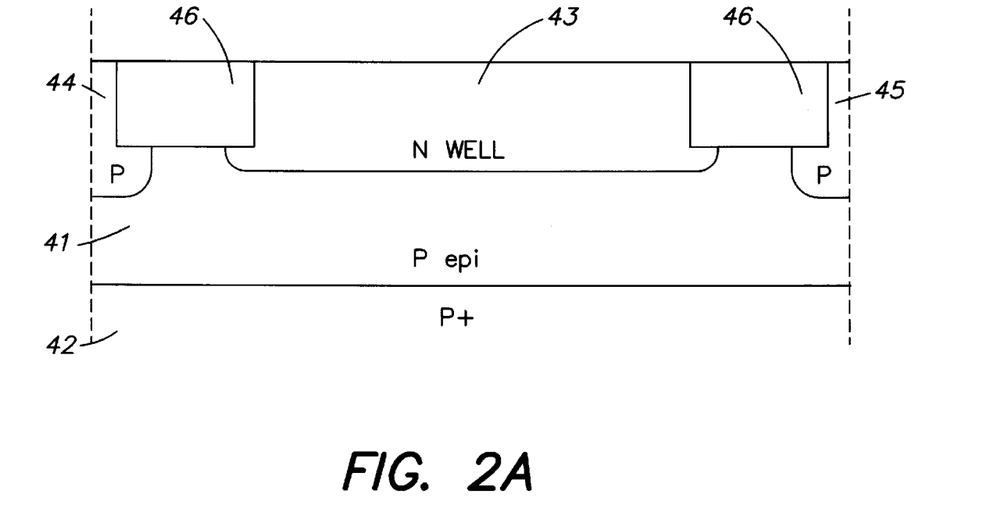
FIGS. 2A to 2C illustrate successive steps of manufacturing a bipolar transistor in a BICMOS integrated circuit according to the present invention.
Figure 2B:
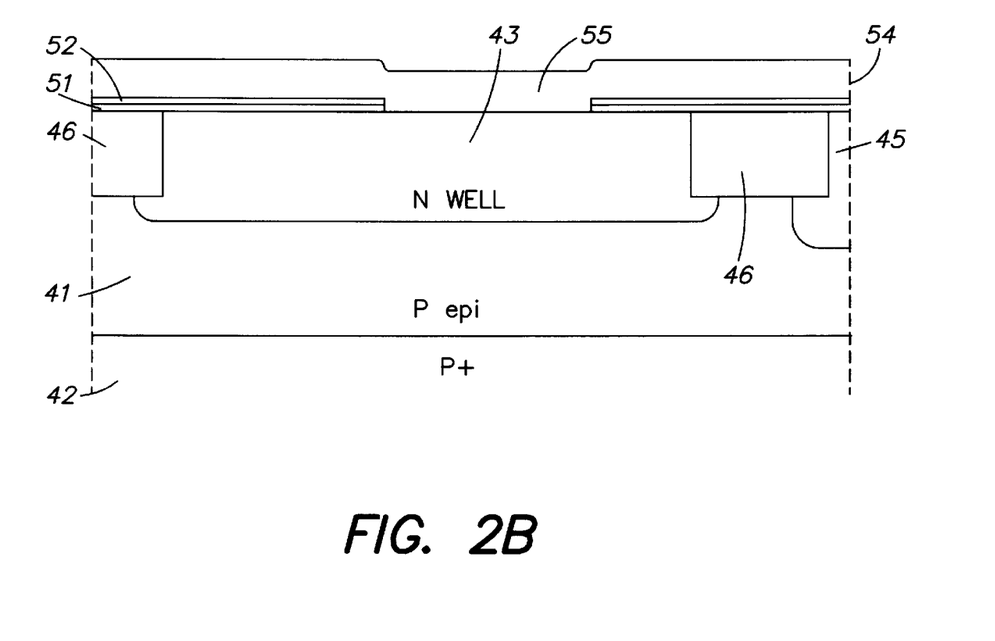
Figure 2C:
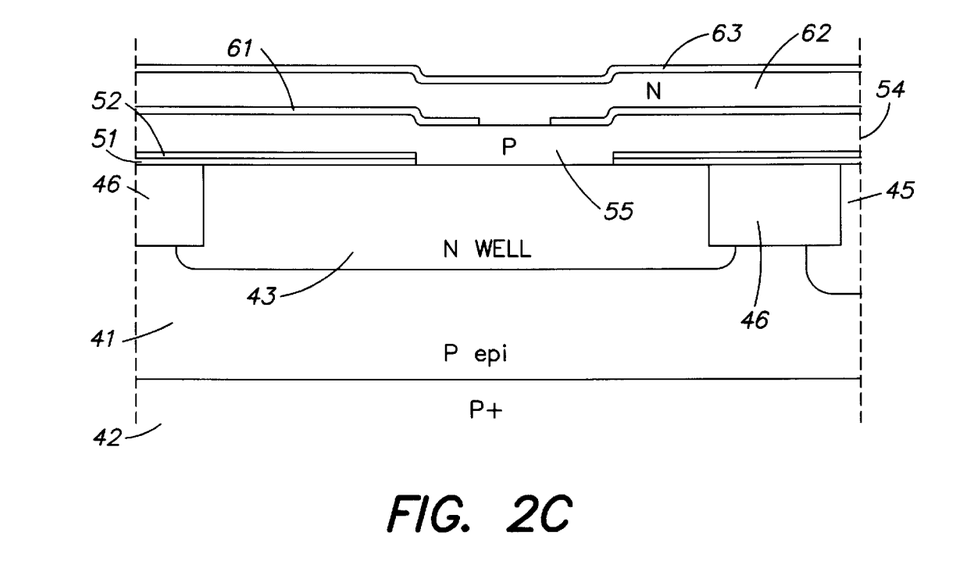

FIGS. 2A and 2C illustrate successive steps of manufacturing a bipolar transistor according to the present invention, this bipolar transistor being included in an integrated circuit including N-channel and P-channel MOS transistors, as described in FIG. 1.

According to an aspect of the present invention, the BICMOS integrated circuit according to the present invention is formed on a lightly-doped P-type layer 41, directly formed by epitaxy on a more heavily-doped P-type single-crystal silicon substrate 42. Thus, the starting point is a $P^-$-type epitaxied layer on a $P^+$-type substrate, as currently used for the manufacturing of CMOS-type integrated circuits. This structure has the advantage, with respect to that described in relation with FIG. 1, of not including buried layers between the single-crystal substrate and the epitaxial layer, which significantly reduces the number of manufacturing steps and thus the manufacturing cost and time. The obtained MOS transistors are similar to those shown in FIG. 1, except that no N-type (12) or P-type (22) buried layer is provided under the respective MOS transistors and that the N and P wells stop in the epitaxial layer before reaching substrate 42.

A bipolar transistor according to the present invention is formed in an N-type well 43, preferably similar to the N-type wells in which are formed the P-channel MOS transistors. On either side of N well 43, portions of P-type well 44 and 45 in which are, for example, formed N-channel MOS transistors similar to that formed in well 21 of FIG. 1 have been shown. Well 43 is delimited in surface by a thick oxide ring 46. In the embodiment shown, ring 46 is of BOX type, that is, it is formed of an oxide layer arranged in a groove etched in the substrate. These grooves are preferably formed after manufacturing the N and P wells. However, this is only one embodiment of the present invention and thick oxide regions 46 may correspond to oxides formed by the LOCOS method or any other adapted method.

At the step illustrated in FIG. 2B, a thin silicon oxide layer 51 and a polysilicon layer 52 have successively been deposited on the assembly. An opening has been formed in layers 51, 52 above collector area 43. A uniform epitaxial deposition has then been performed. Epitaxial deposition 54 results in the forming of a single-crystal layer 55 above the opening on the collector single-crystal silicon and of a polycrystal layer above polysilicon layer 52.

This step of epitaxial deposition of a silicon layer is one of the fundamental steps of the present invention and is performed in several steps. It will be further detailed hereafter. A silicon layer 54 having its portion 55 located above the opening made in layers 51, 52, which will form the base region of the NPN bipolar transistor is thus obtained. It should be noted that this epitaxial deposition raises no particular problems since it is made on a substantially homogeneous support formed by polysilicon layer 52 in which are formed small windows. Further, as will be seen hereafter, this deposition is thin (thickness under 0.2 $\mu$m) as compared to the epitaxial layer of FIG. 1 (thickness greater than 1 $\mu$m).

FIG. 2C illustrates steps of formation of the emitter of the NPN transistor. An insulating layer 61, which may be formed of an assembly of several thin insulating layers, is first deposited on the entire layer 54. Layer 61 is then opened at the emitter locations by a plasma etching followed by a chemical etching. After this, a heavily-doped N-type polysilicon layer 62 is deposited by chemical vapor-phase deposition. This polysilicon layer is intended for forming a source of dopants to be diffused in base region 55 and to be used as an emitter contact area. Polysilicon layer 62 is preferably covered with a protection layer 63, for example, made of silicon oxide.

Steps of etching the emitter contact polysilicon 62, of etching polysilicon layer 54 outside base region 55, of P-type doping a base contact recovery region, and of N-type doping a collector contact recovery region, are then provided. The result of these steps is illustrated in the top view of masks of FIG. 3 and in the cross-section views along lines A—A and B—B of this FIG. 3, respectively illustrated in FIGS. 4A and 4B.

Figure 4A:
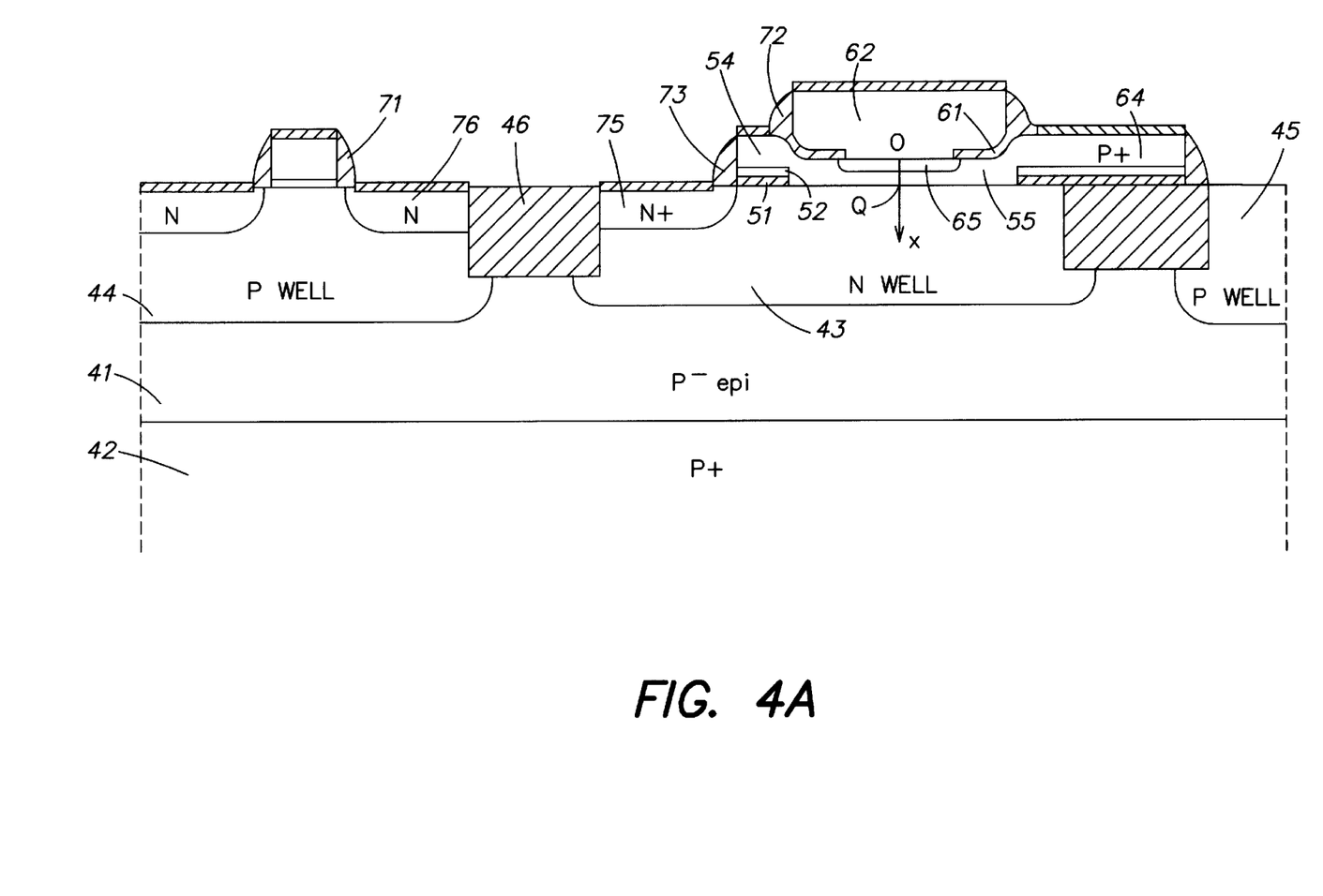
FIG. 4A shows a cross-section view along line A—A of the bipolar transistor obtained with the masks of FIG. 3.

FIG. 4A corresponds to a cross-section view taken in the same plane as FIGS. 2A to 2C. However, in the cross-section view, an N-channel MOS transistor formed next to the bipolar transistor according to the present invention has further been partially shown.

As can be seen in FIG. 4A, emitter polysilicon layer 62 has first been etched, then base silicon layer 54 has been etched. An overhanging portion 64 of base silicon area 54 has been left in place above a thick oxide region to form a base contact recovery area. It should be noted that the N dopant contained in polysilicon layer 62 has slightly diffused into epitaxial layer 55 to form an emitter area 65. After cutting layers 62 and 54, spacers are simultaneously formed on the side of the bipolar transistors and on the side of the MOS transistors. Spacers 71 are thus formed on the side of the N-channel MOS transistor shown to the left of the drawing, while spacers 72 are formed on the edges of polysilicon layer 62 and spacers 73 are formed on the edges of the base silicon layer. Spacer 72 on the right-hand side of FIG. 4A is used to delimit the P implantation intended for overdoping extension 64 of the base silicon layer to form a base contact recovery area at the same time as the drains and sources of the P-channel MOS transistors are formed. Similarly, spacer 73 shown in FIG. 4A to the left of the base silicon layer is used to delimit an $N^+$-type collector contact recovery implantation 75 formed at the same time as the drains and sources 76 of the N-channel MOS transistors. Then, a silicide may be formed on all apparent silicon regions to improve the contact recoveries.

Figure 3:
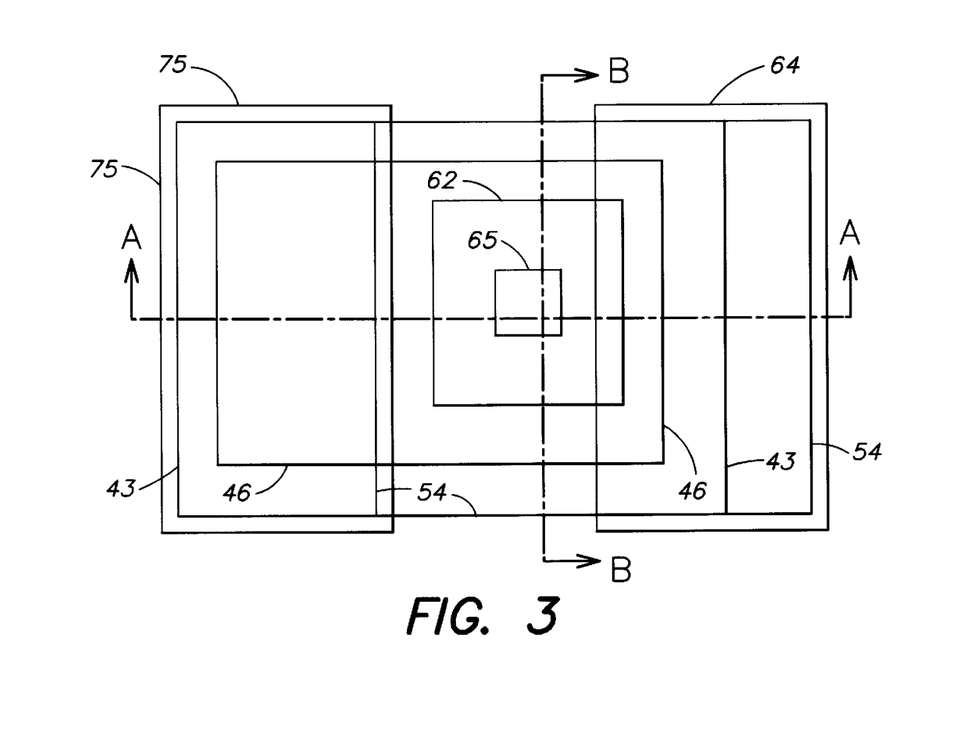
FIG. 3 shows a top view of masks used to form a bipolar transistor obtained by the method according to the present invention.
Figure 4B:
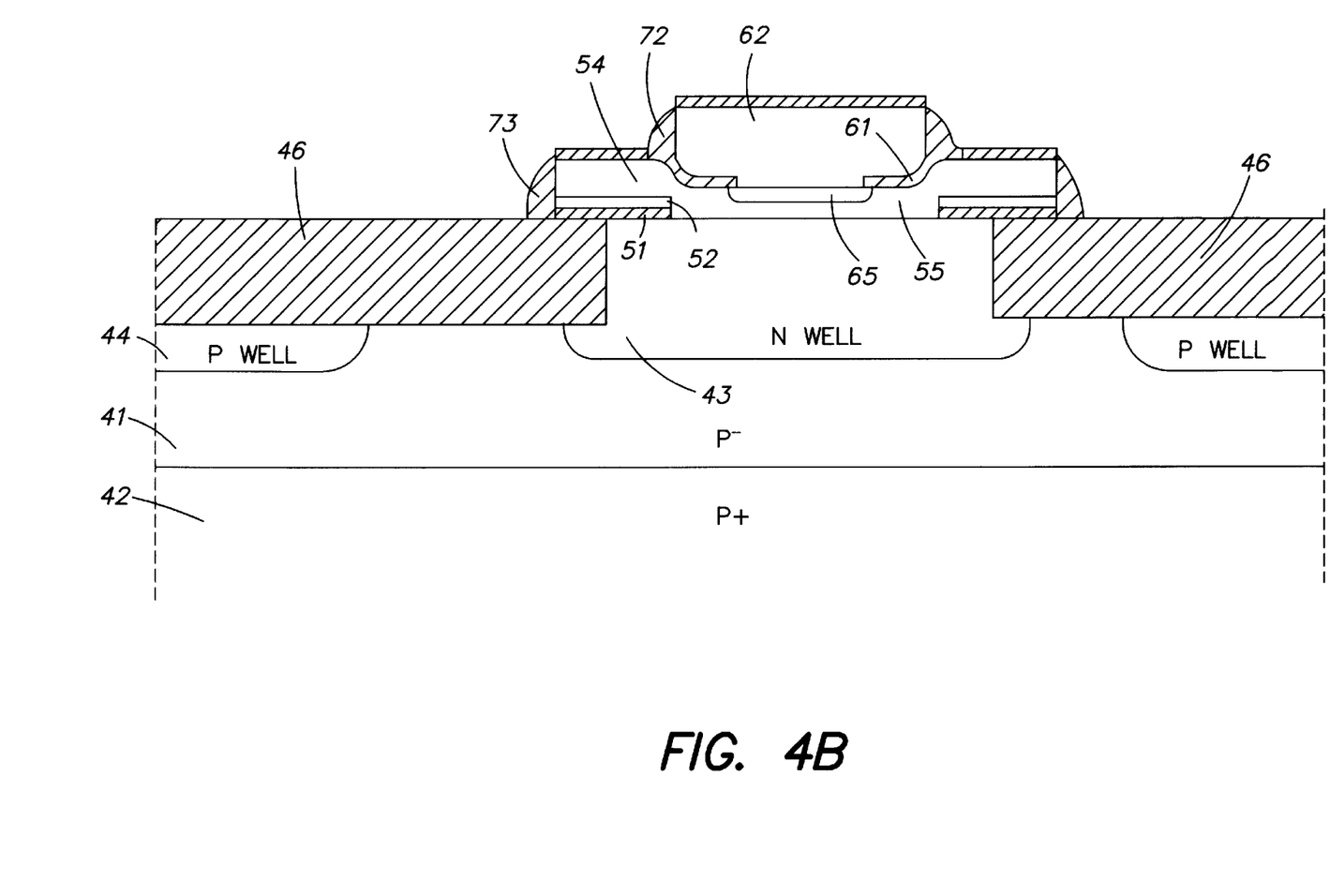
FIG. 4B shows a cross-section view along line B—B of the bipolar transistor obtained with the masks of FIG. 3.

FIGS. 3 and 4B will not be further described. They bear the same references as FIG. 4A and are intended to make the topology of the component according to the present invention and especially, of the base and collector contact recovery areas, clearer. In FIG. 3, the various masks are designated by the name of the areas that they are meant to form. It should be noted that due to the presence of spacers 72 and 73, masks 64 and 75 are not critical.

Figure 5A:
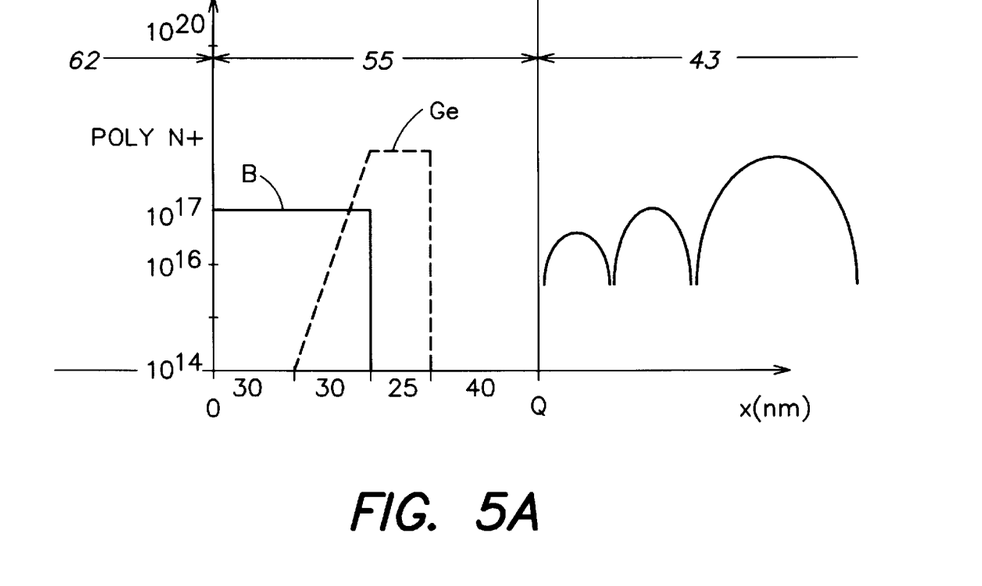
FIGS. 5A and 5B show the dopant concentrations before and after annealing according to the thickness in the emitter/base/collector region of a bipolar transistor according to the present invention.
Figure 5B:
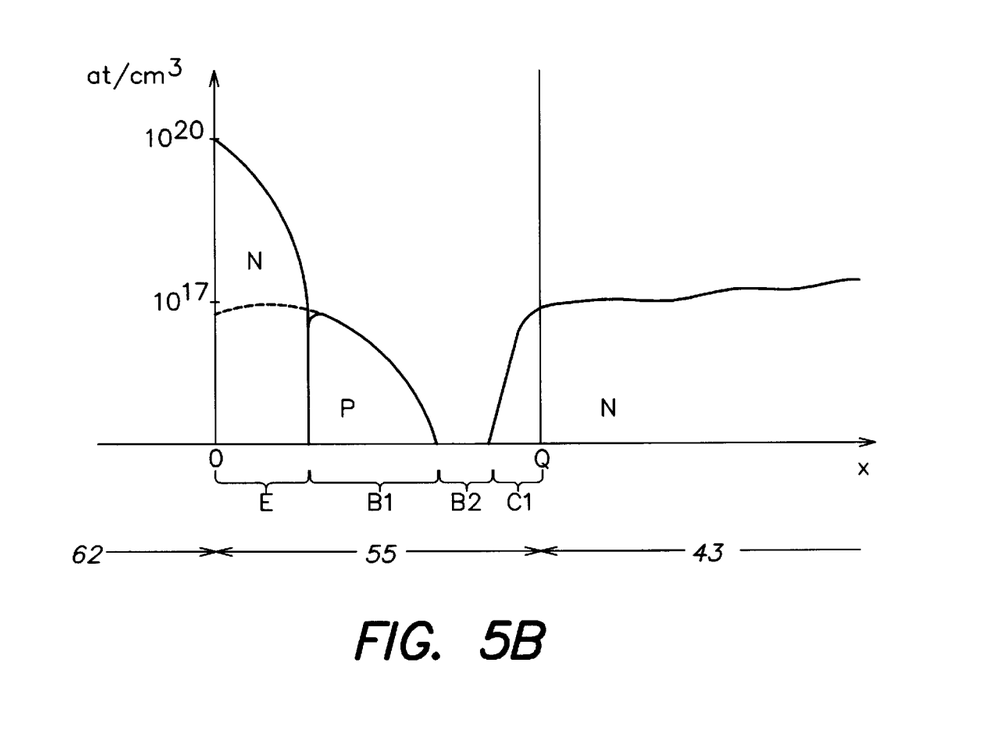

FIG. 5A shows implantation profiles before annealing, transversally to the collector-base-emitter region, along axis Ox indicated in FIG. 4A, that is, taking as an origin the limit between base silicon epitaxial area 55 and emitter contact polysilicon layer 62, towards collector layer 43. FIG. 5B shows these same profiles after annealing.

First, it should be noted that collector 43, in a conventional embodiment of a PMOS transistor N well, results from a triple implantation. Three successive implantations are performed at decreasing energies and doses so that the N well has, after annealing, as shown in FIG. 5B, a substantially uniform concentration profile with a surface concentration on the order of $10^{17}$ atoms/cm$^3$.

In an embodiment of the present invention, epitaxial layer 54 is formed in four phases. In a first phase, a pure silicon epitaxy, that is, of undoped silicon, is performed. This epitaxy for example extends over a thickness of approximately 40 nm from surface Q of N well 43. In a second phase, over a thickness of approximately 25 nm, an epitaxy of undoped silicon but added with approximately 12% of germanium is performed. In a third phase, over a thickness of approximately 30 nm, the epitaxy is carried on while progressively reducing the germanium concentration to reach a null germanium concentration. This third epitaxy phase is performed in the presence of a boron source so that the boron concentration is on the order of $10^{17}$ atoms/cm$^3$. Finally, the fourth epitaxy phase is performed in the presence of boron and in the absence of germanium so that the boron concentration remains on the order of $10^{17}$ atoms/cm$^3$.

FIG. 5B shows the profiles obtained after annealing. In the vicinity of point O, in an area E, the N-type dopants (arsenic) contained in the polysilicon of emitter contact region 62 diffuse into the base, while having a maximum concentration on the order of $10^{19}$ to $10^{20}$ atoms/cm$^3$. This is followed by a P-type region B1 which corresponds to the intrinsic base. In the vicinity of the base-emitter junction, the concentration in P-type dopant is on the order of $10^{17}$ atoms/cm$^3$. The epitaxy has been performed essentially in this base region B1 in the presence of germanium to form a single-crystal silicon-germanium structure. A practically undoped region B2 then follows, itself followed by a region C1 in which N-type atoms of the collector have diffused into the undoped epitaxial layer. Collector well 43 is then formed.

One of the difficulties of formation of the transistor according to the present invention results from the fact that collector well 43 is identical to the N wells used to make MOS transistors of very small dimensions. These wells are relatively heavily doped (on the order of $10^{17}$ atoms/cm$^3$ at the surface, as seen previously). This would provide a bipolar transistor of very poor quality if a diffused base was directly made in well 43; this transistor would both have a small gain and a small Early voltage.

This problem is solved according to an aspect of the present invention by providing, as previously indicated, an epitaxy carried out in several phases. According to an aspect of the present invention, this epitaxy first includes a quasi-intrinsic undoped single-crystal silicon layer, followed by a proper so-called P-type base single-crystal silicon layer. The undoped single-crystal silicon area corresponds, after the thermal annealings, to a very lightly-doped collector area in the vicinity of the base, which enables obtaining a transistor with a relatively high Early voltage.

Further, to help obtaining a high gain value, the present invention preferably provides a proper base area formed of a single-crystal silicon-germanium array, which results in decreasing the potential barrier seen by the electrons to pass from the emitter into the base and thus in obtaining a stronger collector current for a given base current. The fact that the gain can also be raised by the use of germanium enables using a relatively high base doping, which results, in a known way, in improving the transistor characteristics, especially by increasing the Early voltage of the transistor.

The present invention is likely to have various alterations, modifications, and improvements which will readily occur to those skilled in the art. For example, once the opening in layer 52 has been made, an N-type drive-in may be performed before creating an epitaxial growth to further improve the collector conductivity under the base-collector junction.

It should thus be noted that the transistor according to the present invention provides a good compromise between a high gain, a good Early voltage and a small resistance of access to the collector. This small access resistance is due to the fact that collector contact recovery area 75 is very close to the intrinsic base region due to the self-alignments used in the present invention as discussed previously. For example, the emitter opening may have a width of 0.35 μm, the base opening may have a width of 1.35 μm, the remaining region of layers 51, 52 on the side of collector contact 75 may have a width on the order of 0.2 μm, and spacer 73 may have a width on the order of 0.1 μm. The collector contact thus is at less than 1 μm from the center of the intrinsic base region.

A detailed example of implementation of the method according to the present invention will now be disclosed based on a CMOS 0.25-μm BOX insulation or 0.35-μm LOCOS insulation technology. This method includes the steps of:

performing the normal steps of manufacturing the CMOS transistors until the steps of lightly-doped drain and source (LDD) implantation;

using the N well implantation to form the collector region of the NPN transistor;

depositing by chemical vapor-phase deposition an oxide layer (51) of a thickness of approximately 20 nm, and a polysilicon layer (52) of a thickness of approximately 50 nm;

first etching the polysilicon (52), then by wet etching, etching the residual oxide (51) to avoid damaging the apparent surface of the N well;

performing the previously-described epitaxies;

depositing by chemical vapor-phase deposition an oxide layer of a thickness of approximately 20 nm, and a nitride layer of a thickness of approximately 30 nm to form layer 61 of FIG. 2C;

etching under plasma the nitride layer, possibly performing a deep collector implantation, and etching by wet etching the residual oxide layer;

depositing the emitter polysilicon layer (62) and doping it with arsenic in situ or by implantation;

depositing a thin encapsulation oxide layer (63, FIG. 2C) over a thickness on the order of 20 nm;

performing the various steps described in relation with FIGS. 3, 4A and 4B.

In addition to the simplification of the previously-described method, resulting from the elimination of the buried layers before the epitaxy, the present invention provides a component with reduced surface area. Indeed, due to the elimination of the collector well, it is not necessary to delimit an area with a thick oxide around the collector bridge, as illustrated in FIG. 1.

Further, making the base contact on a thick oxide further reduces the collector capacitance.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method of manufacturing a BICMOS integrated circuit including an NPN transistor in a heavily-doped P-type wafer coated with a lightly-doped P-type epitaxial layer, including the steps of:

forming an N-type doped well to form the collector of a bipolar transistor, this well having a relatively high and substantially homogeneous doping level;

coating the structure with a polysilicon seed layer and opening the sandwich above portions of the collector well;

epitaxially growing undoped silicon, then epitaxially growing P-type doped silicon forming above the collector region a single-crystal silicon base region;

depositing an insulating layer and opening it at the location of the emitter;

depositing N-type emitter polysilicon;

etching the emitter polysilicon beyond useful areas;

etching the base silicon outside the useful areas while leaving in place, in particular, a portion above a thick oxide region;

forming spacers;

forming a collector contact area at the same time as the drain implantation of the N-channel MOS transistors; and performing a P-type base contact area implantation at the same time as the drain and source implantations of the P-channel MOS transistors.

2. The method of claim 1, wherein the base epitaxy further includes a step of silicon-germanium epitaxy with a proportion of germanium on the order of 10 to 15%, this phase being performed after the phase of growth of undoped silicon.

3. The method of claim 1, wherein the collector well is formed at the same time as the wells of the P-channel MOS transistors.

4. The method of claim 1, wherein the seed polysilicon layer is deposited on a silicon oxide layer.

5. The method of claim 1, wherein the well has a surface doping level on the order of $10^{17}$ atoms/cm$^3$.

* * * * *